United States Patent
Chen et al.

(10) Patent No.: US 7,250,654 B2
(45) Date of Patent: Jul. 31, 2007

(54) NON-VOLATILE MEMORY DEVICE

(75) Inventors: Hsin-Ming Chen, Tainan Hsien (TW); Hai-Ming Lee, Taipei (TW); Shih-Jye Shen, Hsin-Chu (TW); Ching-Hsiang Hsu, Hsin-Chu (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

(21) Appl. No.: 11/163,984

(22) Filed: Nov. 7, 2005

(65) Prior Publication Data

US 2007/0102754 A1    May 10, 2007

(51) Int. Cl.
*H01L 29/792* (2006.01)
(52) U.S. Cl. .................................. 257/324; 438/216
(58) Field of Classification Search ................ 257/324, 257/371; 438/216, 223
See application file for complete search history.

(56) References Cited

U.S. PATENT DOCUMENTS

| | | | | |
|---|---|---|---|---|
| 5,712,178 | A * | 1/1998 | Cho et al. | 438/201 |
| 6,201,275 | B1 * | 3/2001 | Kawasaki et al. | 257/371 |
| 6,709,931 | B2 * | 3/2004 | Kim | 438/275 |
| 2005/0205939 | A1 * | 9/2005 | Lee et al. | 257/371 |
| 2005/0250342 | A1 * | 11/2005 | Ueda | 438/763 |

* cited by examiner

*Primary Examiner*—Phuc T. Dang
(74) *Attorney, Agent, or Firm*—Winston Hsu

(57) ABSTRACT

A single-poly non-volatile memory device invented to integrate into logic process is disclosed. This non-volatile memory device includes a memory cell unit comprising a PMOS access transistor that is serially connected to a PMOS storage transistor formed in a cell array area, and, in a peripheral circuit area, a high-voltage MOS transistor having a high-voltage gate insulation layer is provided. The PMOS access transistor has an access gate oxide layer that has a thickness equal to the thickness of the high-voltage gate insulation layer in a peripheral circuit area.

29 Claims, 15 Drawing Sheets

NON-VOLATILE MEMORY DEVICE

BACKGROUND OF THE INVENTION

1. Field of the Invention

The present invention relates generally to the field of semiconductor non-volatile memory devices and, more particularly, to a single-poly non-volatile memory device.

2. Description of the Prior Art

With increasing integration of electrical circuit elements, the trend of manufacturing semiconductor integrated circuits is to integrate memory array region and high-speed logic circuit elements into a single chip to form an embedded memory. The embedded memory not only significantly reduces the circuit area but also greatly increases the signal processing speed.

SONOS technology has been considered as a replacement for floating gate nonvolatile memory due to the simplicity of the bitcell structure and process, high scalability, low voltage operation, and its immunity to extrinsic charge loss and tail bits. SONOS type flash memory cells are constructed having a charge trapping non-conducting dielectric layer, typically a silicon nitride layer, sandwiched between two silicon dioxide layers (insulating layers). The nonconducting dielectric layer functions as an electrical charge trapping medium. A conducting gate layer is placed over the upper silicon dioxide layer.

It is desirable to provide a semiconductor non-volatile memory device that is capable of withstanding higher operation voltages in its peripheral circuit.

SUMMARY OF THE INVENTION

It is one object of the present invention to provide an improved non-volatile memory device and method of fabrication thereof.

According to the claimed invention, a non-volatile memory device is disclosed. The non-volatile memory device includes a memory cell unit disposed in a memory array region of the non-volatile memory device. The memory cell unit comprises a PMOS access transistor and a PMOS storage transistor serially connected to the PMOS access transistor through a floating and commonly used P type doping region. The PMOS access transistor comprises an access gate, a access gate dielectric layer, a P type source doping region and the floating and commonly used P type doping region acting as a drain of the PMOS access transistor. The PMOS storage transistor comprises a control gate, a charge storage structure, a P type drain doping region and the floating and commonly used P type doping region acting as a source of the PMOS storage transistor. The non-volatile memory device further includes a high-voltage MOS transistor disposed in a peripheral circuit region of the non-volatile memory device. The high-voltage MOS transistor comprises a high-voltage gate and a high-voltage gate dielectric layer having a thickness equal to that of the access gate dielectric layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
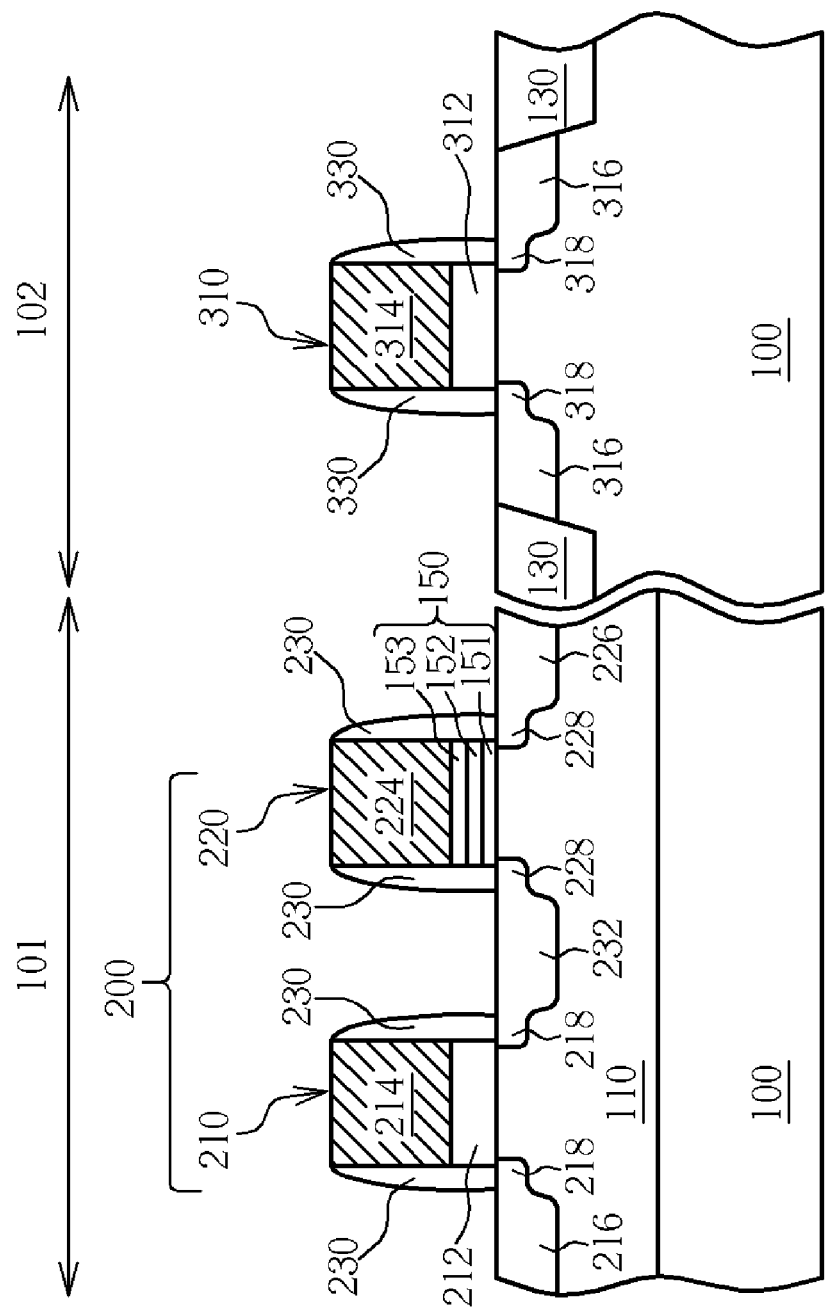
FIG. 1 is a schematic, cross-sectional diagram illustrating a non-volatile memory device in accordance with one preferred embodiment of this invention.

Please refer to FIG. 1. FIG. 1 is a schematic, cross-sectional diagram illustrating a non-volatile memory device in accordance with one preferred embodiment of this invention. As shown in FIG. 1, a semiconductor substrate 100 such as a P type silicon substrate is prepared. A memory array region 101 and a peripheral circuit region 102 are defined on the semiconductor substrate 100. A diffusion cell well 100 such as an N well, which is formed by using conventional ion implantation methods, is provided in the semiconductor substrate 100 within the memory array region 101. Shallow trench isolation (STI) regions 130 are formed on the main surface of the semiconductor substrate 100 to provide device isolation.

At least one non-volatile memory cell unit 200 is formed on the N well 110 within the memory array region 101. The non-volatile memory cell unit 200 includes an access transistor 210 and a storage transistor 220 serially connected to the access transistor 210. According to the preferred embodiment, the access transistor 210 and the storage transistor 220 are both a PMOS transistor. The access transistor 210 comprises a gate electrode 214, a gate dielectric layer disposed between the gate electrode 214 and the N well 110, a P type doping region 216, a P type doping region 232 and P type lightly doped drain (LDD) regions 218. The P type doping region 216 and the P type doping region 232 acts as a source or drain of the access transistor 210. The storage transistor 220 comprises a gate electrode 224, an oxide-nitride-oxide (ONO) dielectric stack 150 disposed between the gate electrode 224 and the N well 110, P type doping regions 232 and 226 acting as source or drain of the storage transistor, and P type LDD regions 228.

In addition, spacers 230 may be formed on sidewalls of the gate electrodes 214 and 224. The ONO dielectric stack 150 includes a bottom oxide layer 151, a silicon nitride trapping layer 152 and a top oxide layer 153. The ONO dielectric stack 150 functions as a charge storage structure. Preferably, the bottom oxide layer 151 has a thickness of about 15-35 angstroms, the silicon nitride trapping layer 152 has a thickness of about 50-100 angstroms, and the top oxide layer 153 has a thickness of about 45-100 angstroms. The storage transistor 220 is serially connected to the access transistor 210 through the P type doping region 232.

A high-voltage MOS transistor 310 is fabricated in the peripheral circuit region 102 and is isolated by the STI region 130. According to the preferred embodiment, the high-voltage MOS transistor 310 comprises a gate electrode 314, spacers 330 disposed on sidewalls of the gate electrode 314, a gate dielectric layer 312 disposed between the gate electrode 314 and the semiconductor substrate 100, source/drain regions 316 and LDD regions 318. The high-voltage MOS transistor 310 may be a PMOS transistor or an NMOS transistor. It is one feature of the present invention that there is no low-voltage transistor device formed in the peripheral circuit region 102, but only high-voltage MOS transistor 310. Therefore, the fabrication process becomes simpler and the number of mask used in the fabrication process is reduced because no low-voltage transistor device is formed in the peripheral circuit region 102, thus reducing the cost.

It is another salient feature of the present invention that the thickness of the gate dielectric layer 312 of the high-voltage MOS transistor 310 in the peripheral circuit region 102 is equal to the thickness of the gate dielectric layer 212 of the access transistor 210 of the non-volatile memory cell unit 200 in the memory array region 101. The gate dielectric 212 of the access transistor 210 can be fabricated at the same steps of forming the gate dielectric 312 of the peripheral high voltage MOS transistor 310. Furthermore, the gate dielectric layers 212 and 312 can be formed at the same step to form the top oxide 153 of ONO dielectric stack 150 by using ISSG oxidation method. The ISSG method will oxidize the nitride layer 152 and form top oxide 153. At the same time, the ISSG method will form the oxide layer 212 and 312. It is still another feature that both of the access transistor 210 and the storage transistor 220 of the non-volatile memory cell unit 200 are PMOS transistors. It is still another feature of the present invention that the access transistor 210 is serially connected with the storage transistor 220 to form the non-volatile memory cell unit 200, making the non-volatile memory of this invention an NOR type memory, rather than an NAND type memory.

Figure 2:
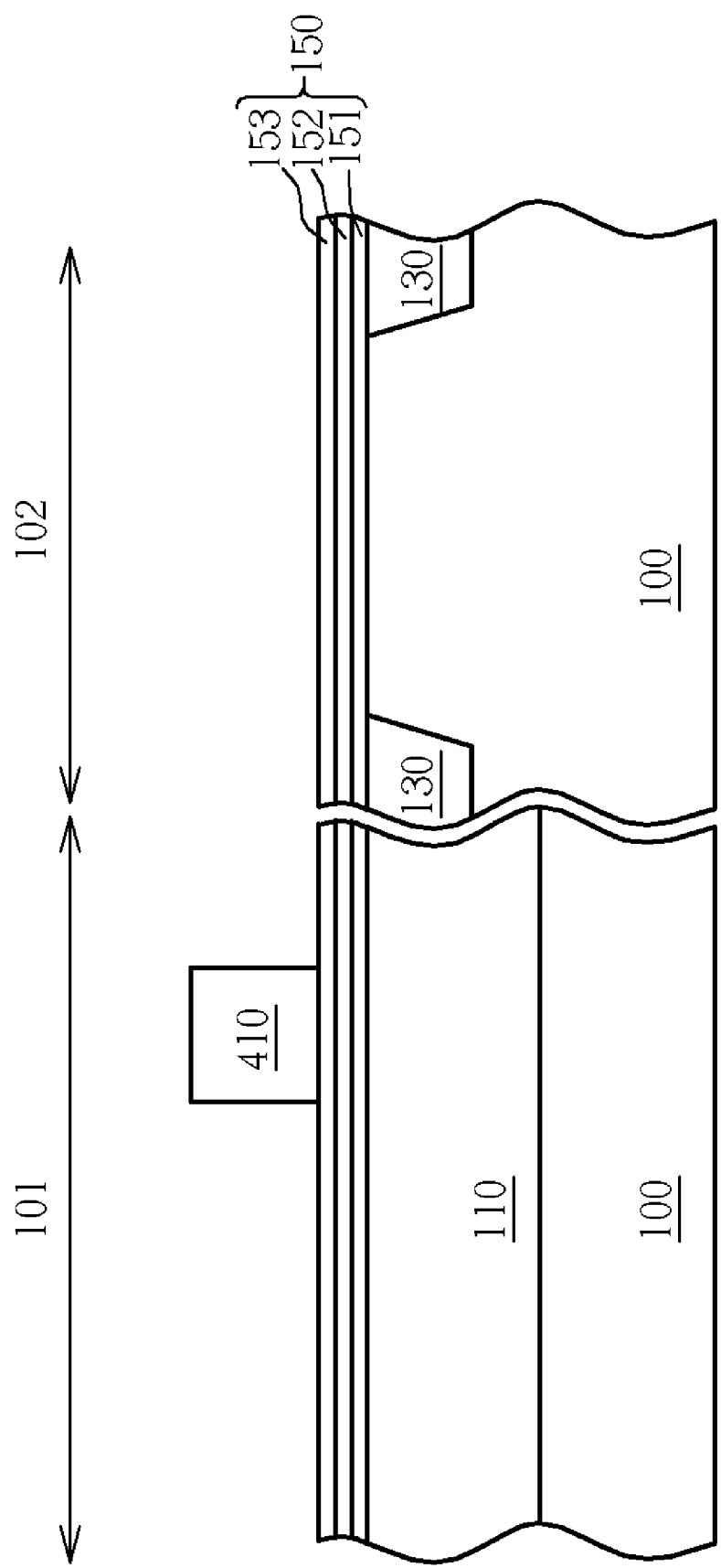
FIGS. 2-7 are schematic cross-sectional diagrams illustrating a process of fabricating the embedded SONOS non-volatile memory according to this invention.

Please refer to FIGS. 2-7. FIGS. 2-7 are schematic cross-sectional diagrams illustrating a process of fabricating the embedded non-volatile memory according to this invention, where like numeral numbers designate like elements, regions or layers. As shown in FIG. 2, a semiconductor substrate 100 having thereon a memory array region 101 and a peripheral circuit region 102 is provided. An N well 110 is formed in the semiconductor substrate 100 within the memory array region 101. The N well 110 is formed by conventional ion implantation methods. Thereafter, STI regions 130 are formed on the main surface of the semiconductor substrate 100. In another case, the STI regions 130 may be formed prior to the formation of the ion well 110. A conventional ONO process is carried out to form an ONO dielectric stack 150 over the semiconductor substrate 100. As previously mentioned, the ONO dielectric stack 150 includes a bottom oxide layer 151, a silicon nitride trapping layer 152 and a top oxide layer 153. A photoresist pattern 410 is then formed on the ONO dielectric stack 150 within the memory array region 101. The photoresist pattern 410 defines a channel region of the storage transistor.

Figure 3:
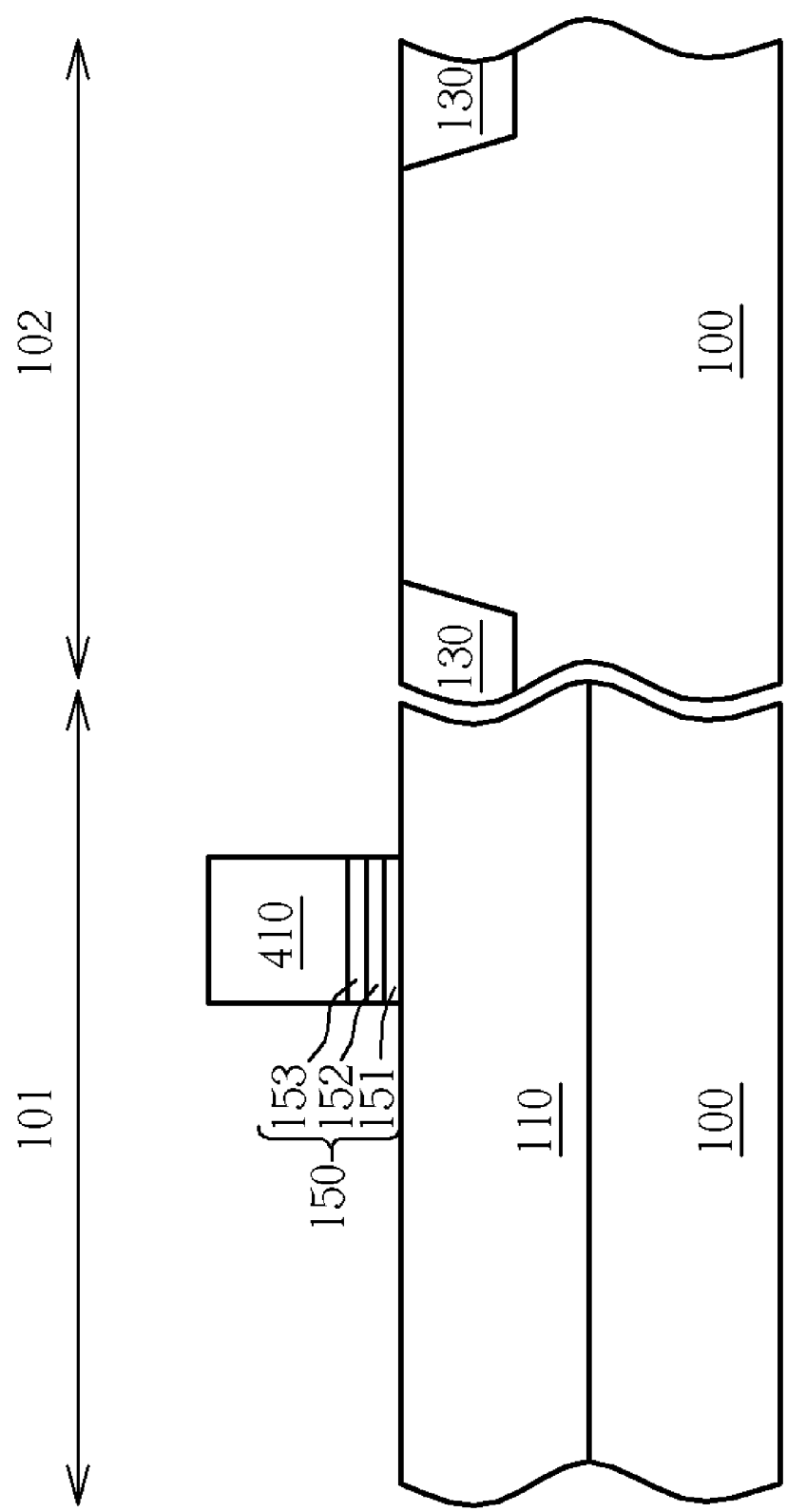

As shown in FIG. 3, using the photoresist pattern 410 as an etching hard mask, a dry etching process is performed to etch away the ONO dielectric stack 150 that is not covered by the photoresist pattern 410. Thereafter, the photoresist pattern 410 is stripped off.

Figure 4:
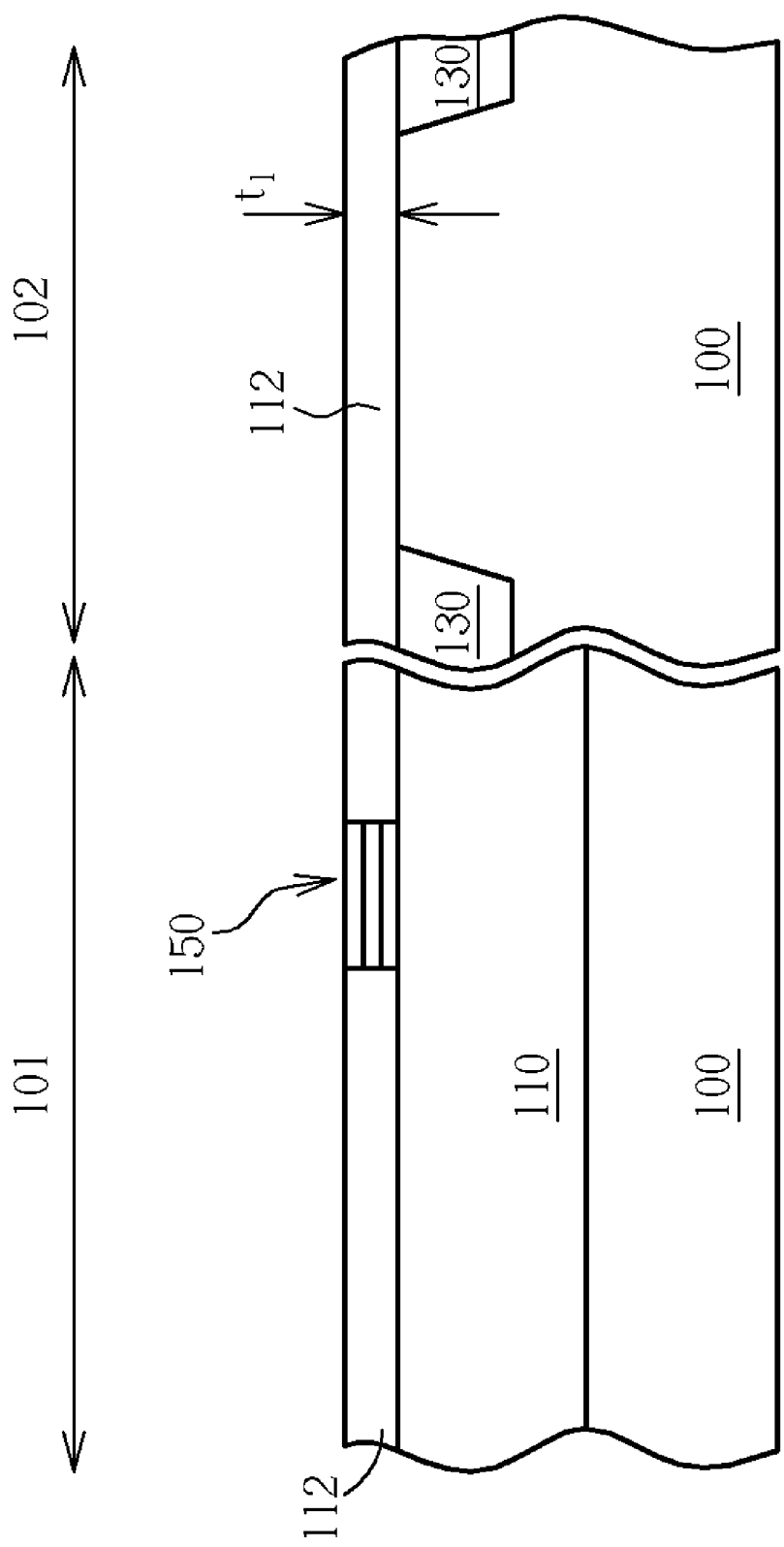

As shown in FIG. 4, a thermal oxidation process is carried out to grow a thick silicon dioxide layer 112 with a thickness $t_1$ on the exposed main surface of the semiconductor substrate 100. The thick silicon dioxide layer 112 functions as a gate dielectric of the high-voltage MOS transistor in the peripheral circuit region 102, and simultaneously, functions as a gate dielectric of the access transistor in the memory array region 101. According to the preferred embodiment, the thickness $t_1$ approximately ranges between 50 and 200 angstroms. As described previously, another way to implement the different transistor dielectric layers is by using ISSG method. ISSG oxidation method is adopted for forming the silicon dioxide layers 312 of access transistor and peripheral high voltage MOS transistor and top oxide layer 153 of the storage transistor.

Figure 5:
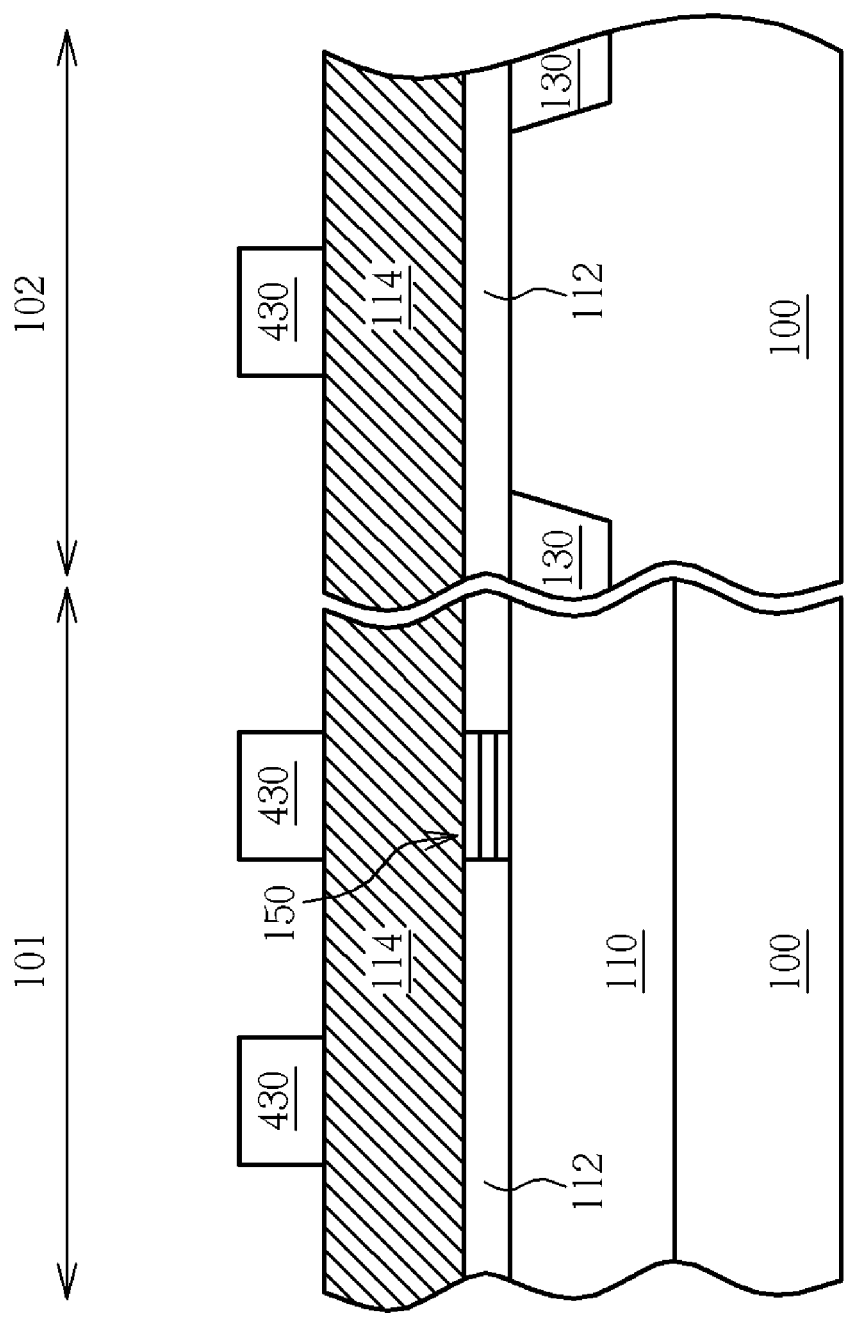

As shown in FIG. 5, a conventional chemical vapor deposition (CVD) is carried out to deposit a doped polysilicon layer 114 over the semiconductor substrate 100. Subsequently, a photoresist pattern 430 is formed on the doped polysilicon layer 114 to define gate pattern in both the memory array region and the peripheral circuit region 102.

Figure 6:
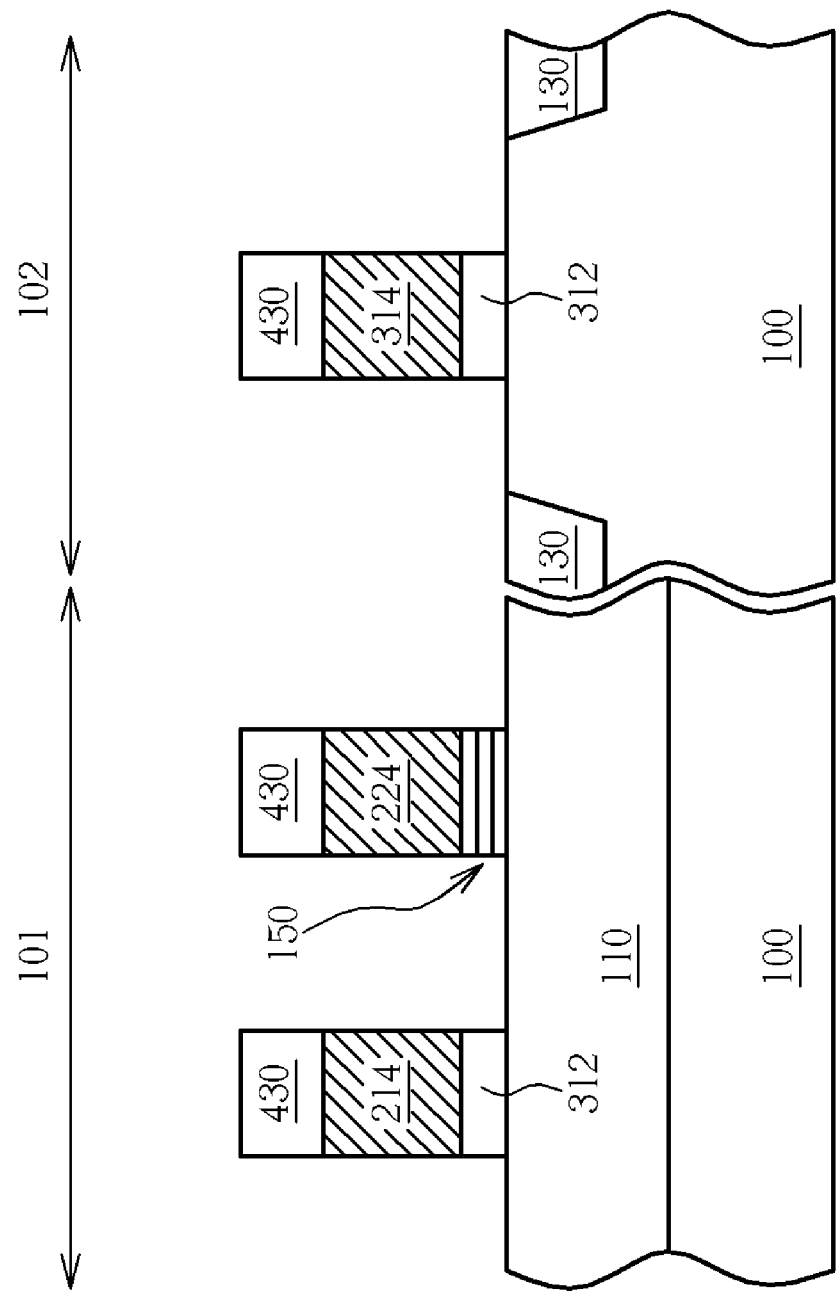

As shown in FIG. 6, using the photoresist pattern 430 as an etching hard mask, an anisotropic dry etching process is performed to etch away the doped polysilicon layer 114 and the silicon dioxide layer 112 that are not covered by the photoresist pattern 430, thereby forming gate electrodes 214 and 224 in the memory array region 101 and gate electrode 314 in the peripheral circuit region 102, wherein the gate electrode 214 is on the gate dielectric layer 312, the gate electrode 224 is on the ONO dielectric stack 150, while the gate electrode 314 is on the gate dielectric layer 312. The photoresist pattern 430 is then removed.

Figure 7:
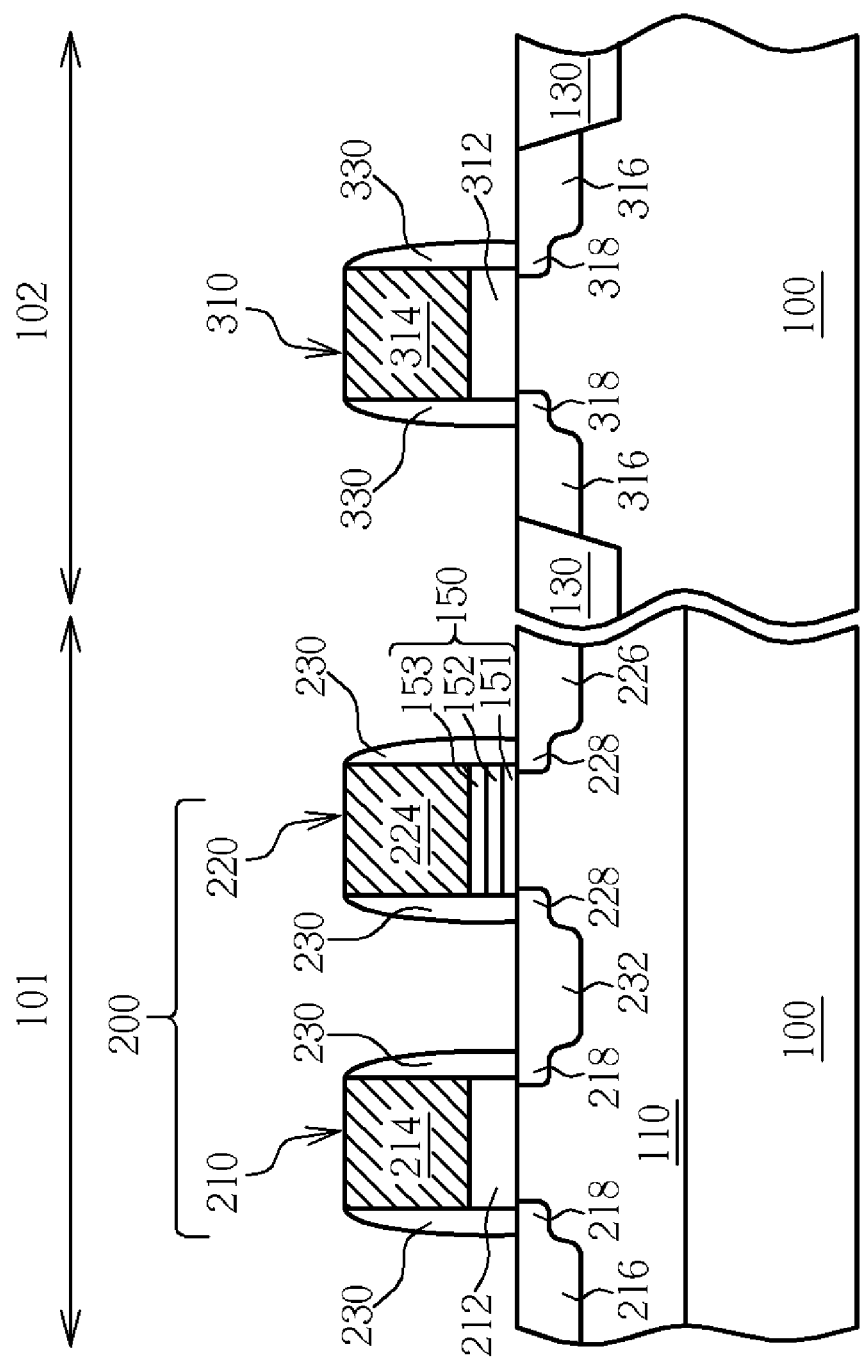

As shown in FIG. 7, after the removal of the photoresist pattern 430, ion implantation processes are carried out to implant dopant species such as boron into the semiconductor substrate 100, thereby forming LDD regions 218, 228 and 318 adjacent to respective gate electrodes. After the formation of the LDD regions, sidewall spacers 230 are formed on sidewalls of the gate electrodes. Thereafter, ion implantation processes are carried out to form heavily doped source/drain regions 216, 226, 232 and 316.

Figure 8:
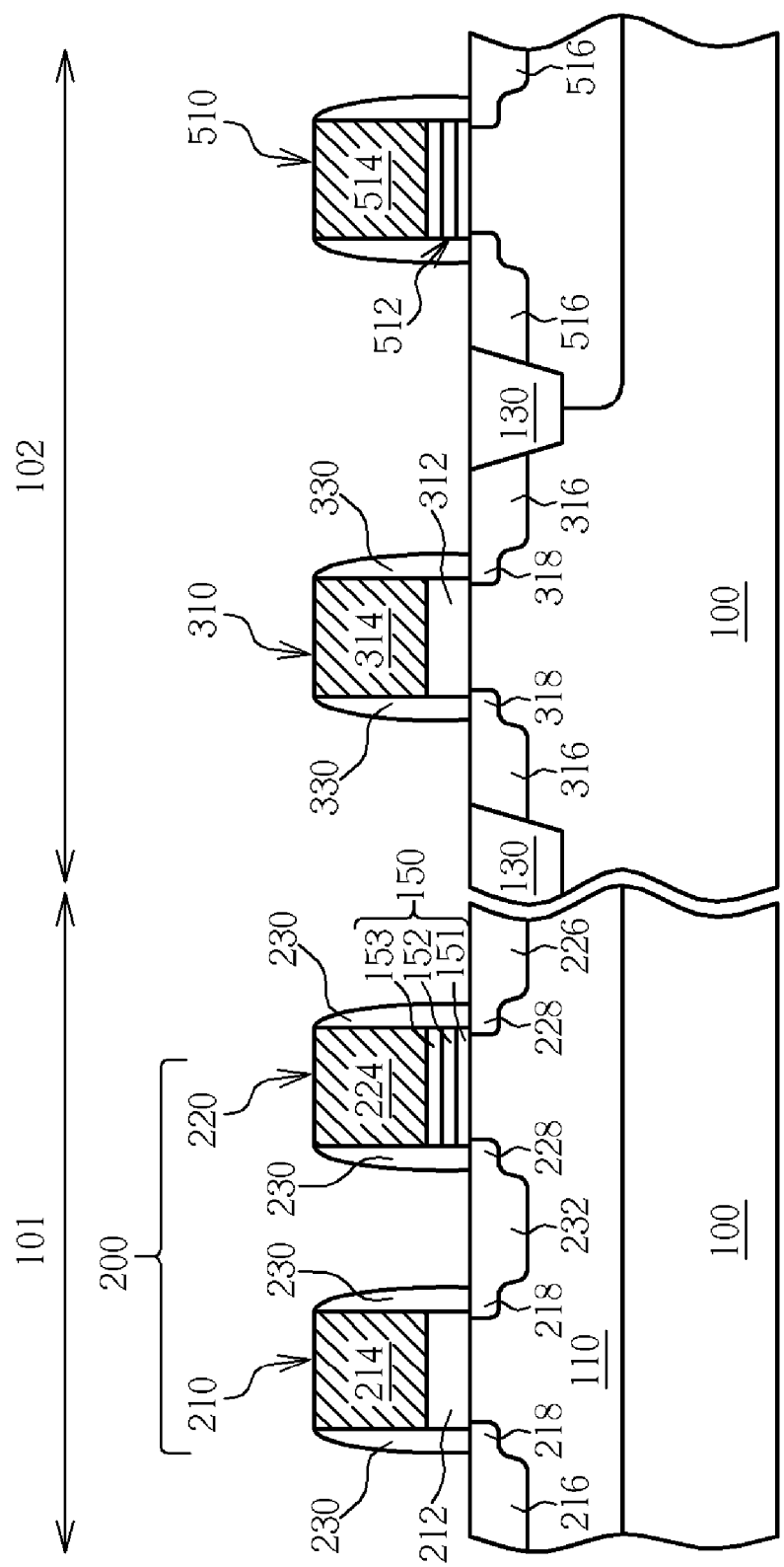
FIG. 8 is a schematic, cross-sectional diagram illustrating a non-volatile memory device in accordance with another preferred embodiment of this invention.

Please refer to FIG. 8. FIG. 8 is a schematic, cross-sectional diagram illustrating a non-volatile memory device in accordance with another preferred embodiment of this invention. As shown in FIG. 8, a semiconductor substrate 100 such as a P type silicon substrate is prepared. Likewise, a memory array region 101 and a peripheral circuit region 102 are defined on the semiconductor substrate 100. A diffusion cell well 100 such as an N well, which is formed by using conventional ion implantation methods, is provided in the semiconductor substrate 100 within the memory array region 101. STI regions 130 are formed on the main surface of the semiconductor substrate 100 to provide device isolation.

The difference between the preferred embodiment of FIG. 1 and the preferred embodiment of FIG. 8 is that, in FIG. 8, in addition to the high-voltage MOS transistor 310, a transistor 510 having the same structure as that of the storage transistor in memory array region 101 is provided in peripheral circuit region 102. The transistor 510 has an ONO dielectric stack 512, gate electrode 514 and source/drain regions 516. According to this invention, the transistor 510 functions as a circuit element for trimming reference circuit of the sense amplifier. This makes the reference circuit of the sense amplifier operate in a more precise manner. From another aspect, the transistor 510 may be inserted into the sense amplifier and provide the sense amplifier with reference current. It is advantageous to do so because the sense amplifier and the reference current thereof can keep track of the characteristic variation of the memory cells in the memory array region, thereby increasing the memory window, getting better yield and reliability.

Figure 9:
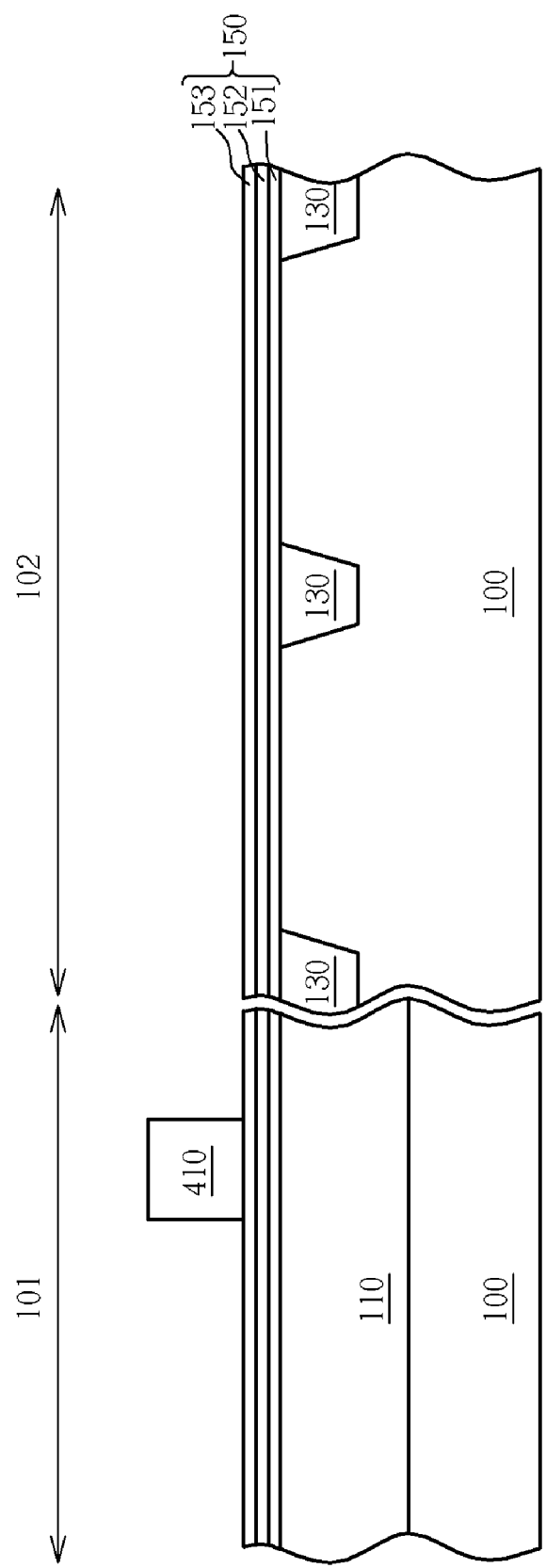
FIGS. 9-14 are schematic cross-sectional diagrams illustrating a process of fabricating the embedded SONOS non-volatile memory according to another preferred embodiment this invention.

Please refer to FIGS. 9-14. FIGS. 9-14 are schematic cross-sectional diagrams illustrating a process of fabricating the embedded non-volatile memory according to another preferred embodiment this invention, where like numeral numbers designate like elements, regions or layers. As shown in FIG. 9, a semiconductor substrate 100 having thereon a memory array region 101 and a peripheral circuit region 102 is provided. An N well 110 is formed in the semiconductor substrate 100 within the memory array region 101. The N well 110 is formed by conventional ion implantation methods. Thereafter, STI regions 130 are formed on the main surface of the semiconductor substrate 100. In another case, the STI regions 130 may be formed prior to the formation of the ion well 110. A conventional ONO process is carried out to form an ONO dielectric stack 150 over the semiconductor substrate 100. The ONO dielectric stack 150 includes a bottom oxide layer 151, a silicon nitride trapping layer 152 and a top oxide layer 153. A photoresist pattern 410 is then formed on the ONO dielectric stack 150 within the memory array region 101. The photoresist pattern 410 defines a channel region of the storage transistor.

Figure 10:
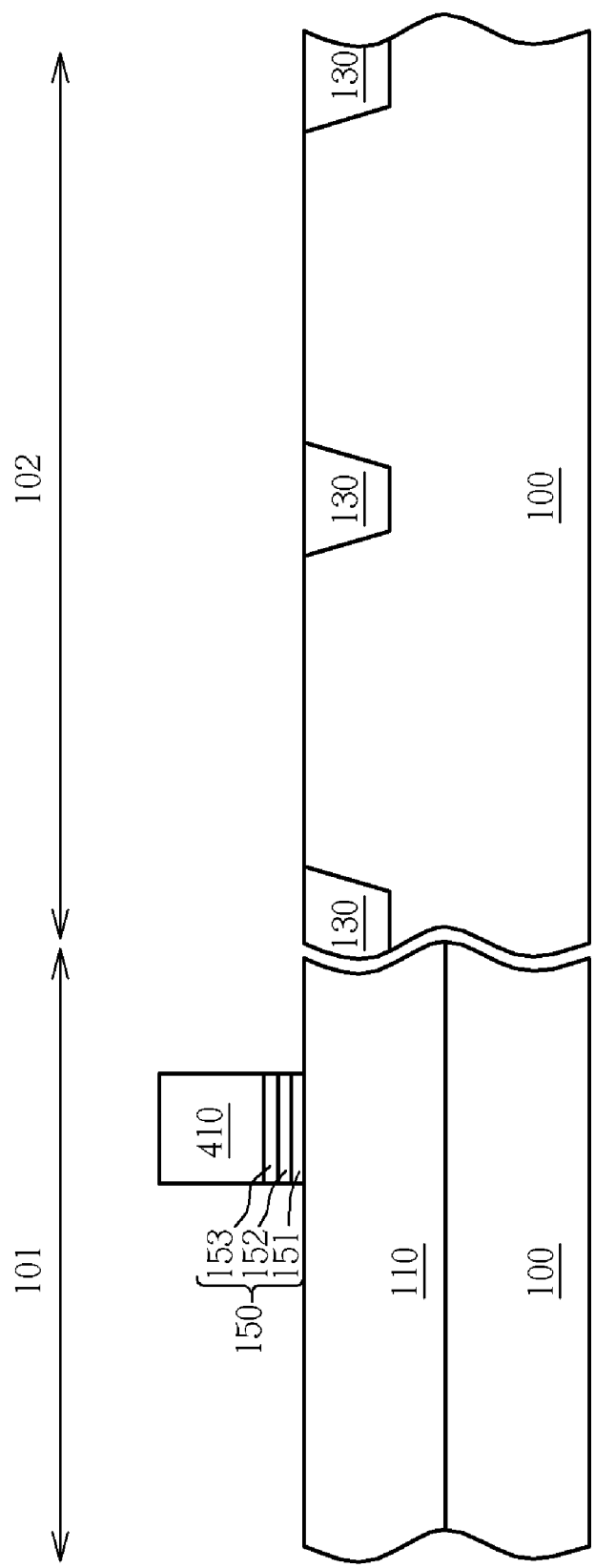

As shown in FIG. 10, using the photoresist pattern 410 as an etching hard mask, a dry etching process is performed to etch away the ONO dielectric stack 150 that is not covered by the photoresist pattern 410. Thereafter, the photoresist pattern 410 is stripped off.

Figure 11:
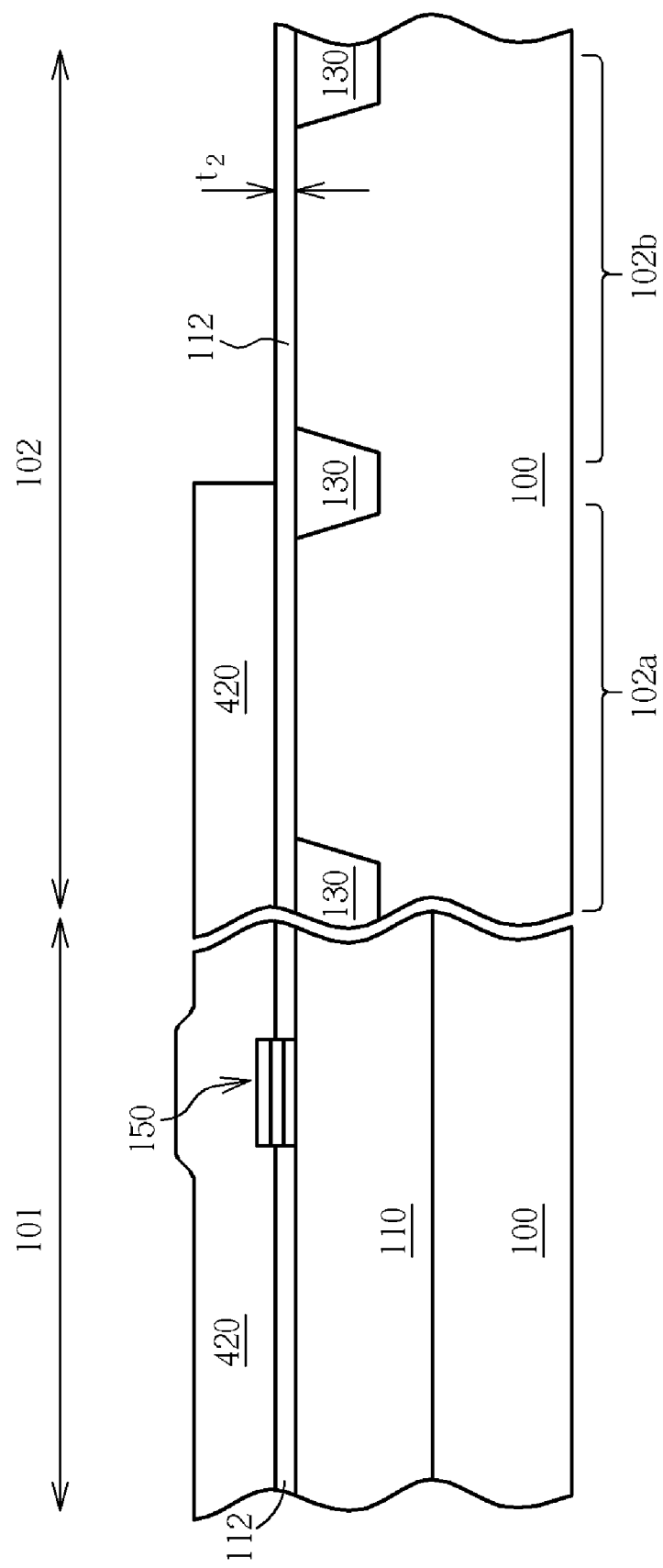

As shown in FIG. 11, a thermal oxidation process is carried out to grow a thick silicon dioxide layer 112 with a thickness $t_2$ on the exposed main surface of the semiconductor substrate 100. The thick silicon dioxide layer 112 functions as a gate dielectric of the high-voltage MOS transistor in the peripheral circuit region 102, and simultaneously, functions as a gate dielectric of the access transistor in the memory array region 101. According to the preferred embodiment, the thickness $t_2$ approximately ranges between 30 and 200 angstroms. A photoresist pattern 420 is formed over the semiconductor substrate 100, which masks the memory array region 101 and active area 102a for high-voltage MOS transistor of the peripheral circuit region 102, while exposes the active area 102b for low-voltage MOS transistor.

Figure 12:
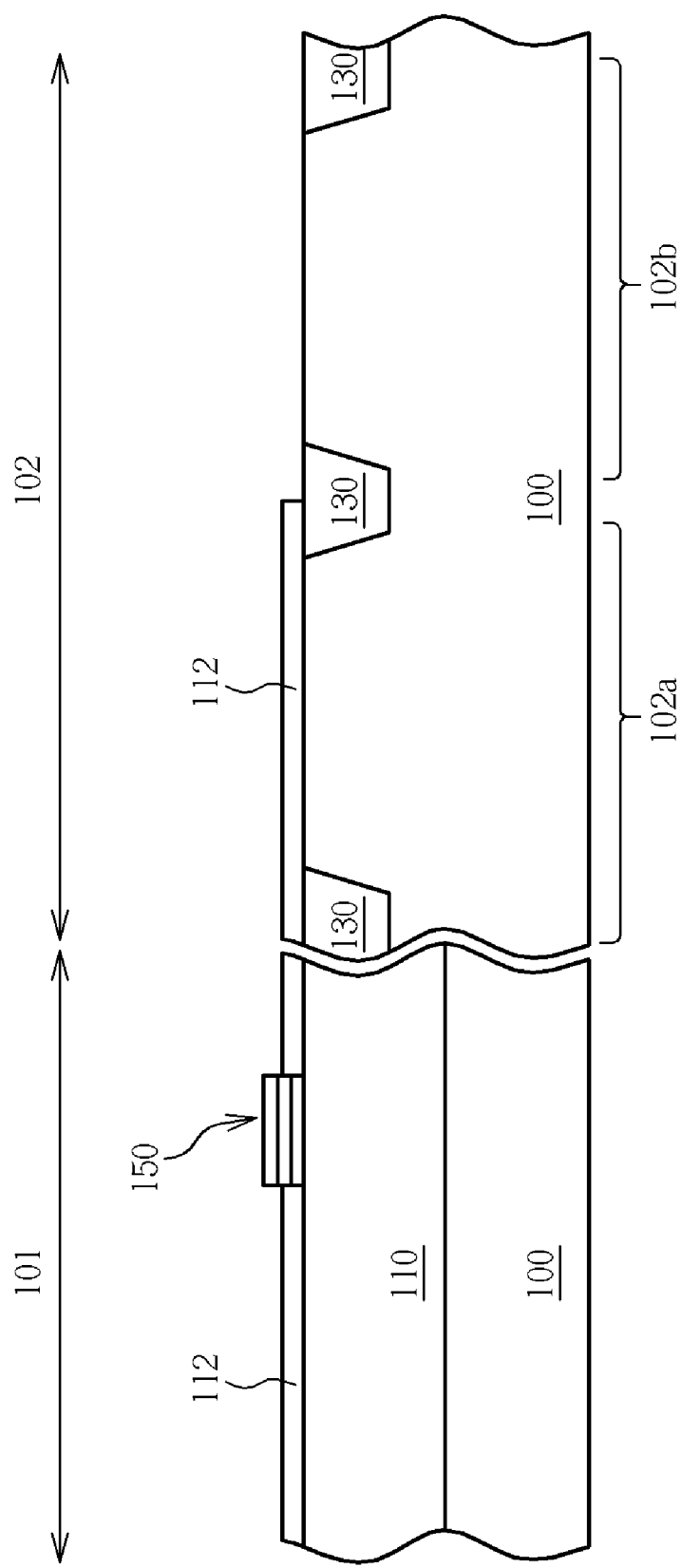

As shown in FIG. 12, an etching process is performed to etch away the silicon dioxide layer 112 that is not covered by the photoresist pattern 420. The photoresist pattern 420 is then stripped off.

Figure 13:
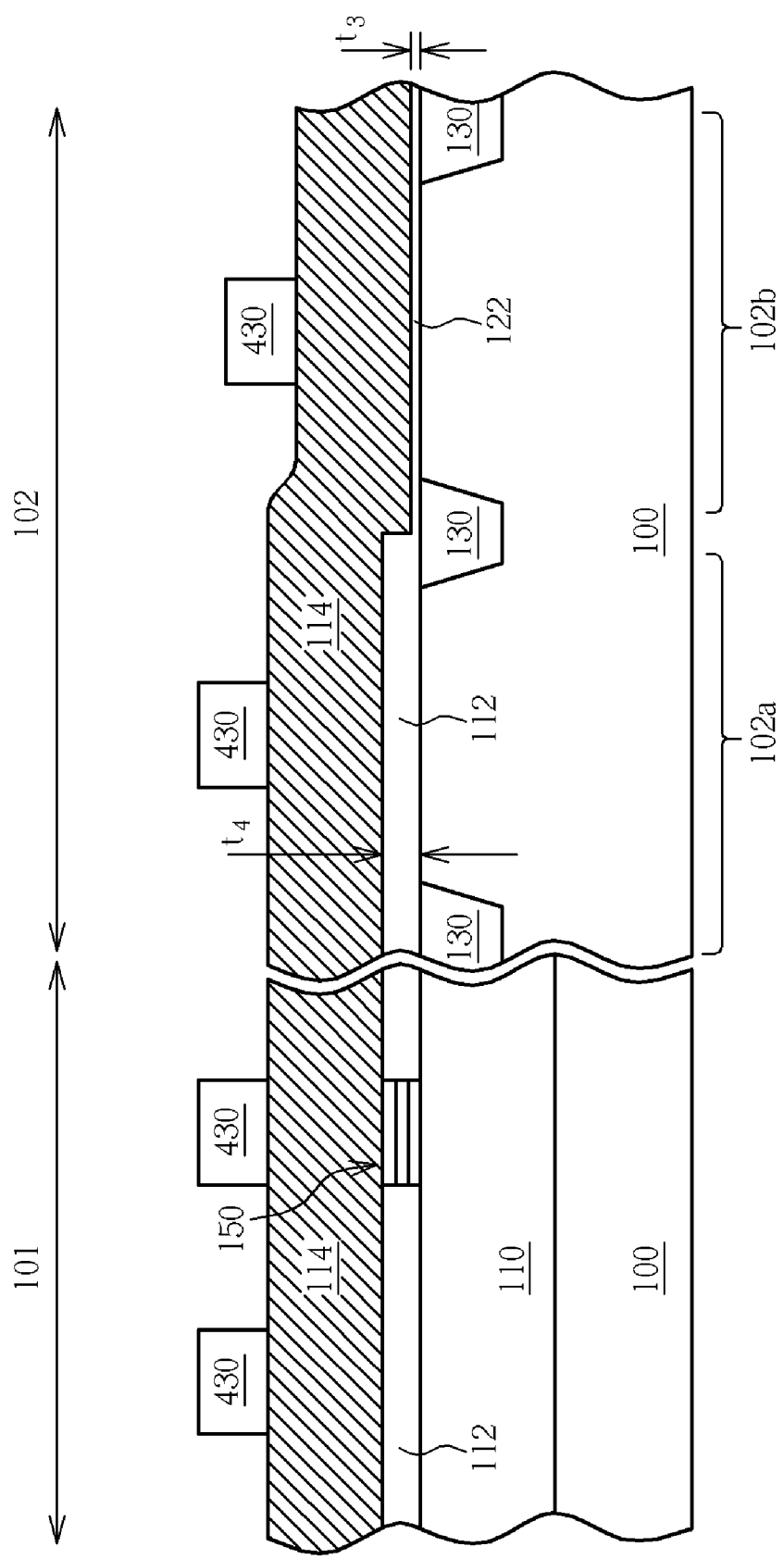

As shown in FIG. 13, a thermal oxidation process such as furnace oxidation process is carried out to grow a thinner silicon dioxide layer 122 with a thickness $t_3$ on the exposed active area 102b in the peripheral circuit region 102, wherein $t_3 < t_2$. This thermal oxidation process also increases the thickness of the silicon dioxide layer 112 from $t_2$ to $t_4$. Preferably, the thickness $t_3$ ranges between 15 and 100 angstroms, and $t_4$ ranges between 50 and 200 angstroms, but not limited thereto.

Subsequently, a conventional chemical vapor deposition (CVD) is carried out to deposit a doped polysilicon layer 114 over the semiconductor substrate 100. Subsequently, a photoresist pattern 430 is formed on the doped polysilicon layer 114 to define gate pattern in both the memory array region and the peripheral circuit region 102.

Figure 14:
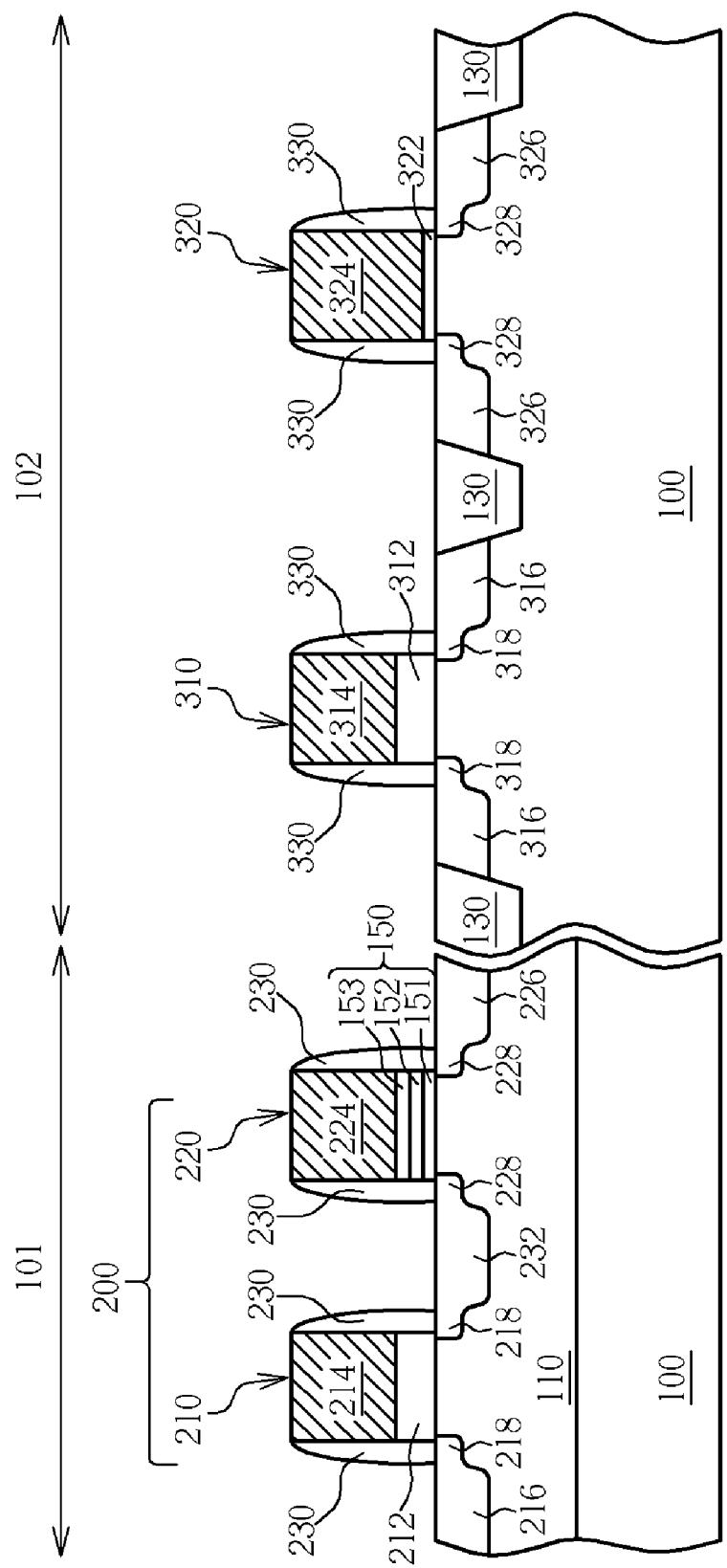

As shown in FIG. 14, using the photoresist pattern 430 as an etching hard mask, an anisotropic dry etching process is performed to etch away the doped polysilicon layer 114 that are not covered by the photoresist pattern 430, thereby forming gate electrodes 214 and 224 in the memory array region 101 and gate electrodes 314 and 324 in the peripheral circuit region 102, wherein the gate electrode 214 is on the gate dielectric layer 312, the gate electrode 224 is on the ONO dielectric stack 150, the gate electrode 314 is on the gate dielectric layer 312, and gate electrode 324 is on the gate dielectric layer 322. The photoresist pattern 430 is then removed.

After the removal of the photoresist pattern 430, ion implantation processes are carried out to implant dopant species into the semiconductor substrate 100, thereby forming LDD regions 218, 228, 318 and 328 adjacent to respective gate electrodes. After the formation of the LDD regions, sidewall spacers 230 and 330 are formed on respective sidewalls of the gate electrodes. Thereafter, ion implantation processes are carried out to form heavily doped source/drain regions 216, 226, 232, 316 and 326. It is noteworthy that the thickness of the gate dielectric layer 312 of the high-voltage MOS transistor 310 in the peripheral circuit region 102 is equal to the thickness of the gate dielectric layer 212 of the access transistor 210 in the memory array region 101.

Figure 15:
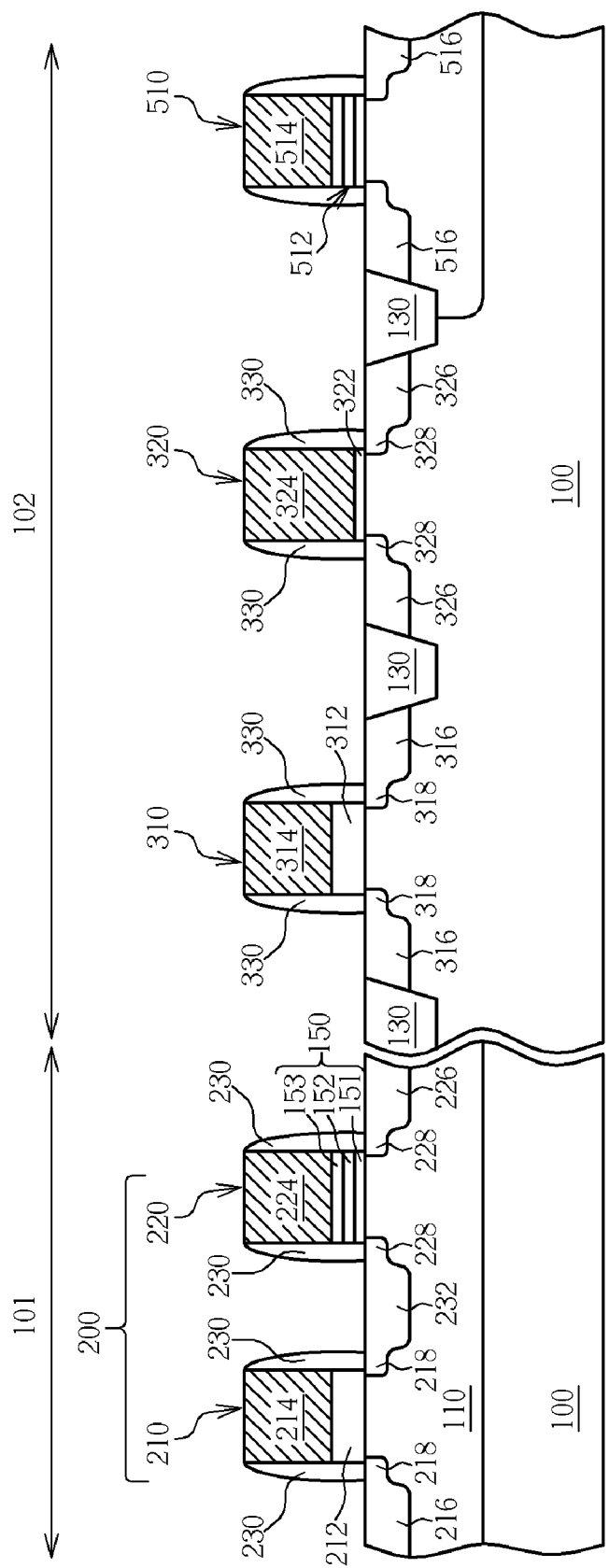
FIG. 15 is a schematic, cross-sectional diagram illustrating a non-volatile memory device in accordance with still another preferred embodiment of this invention.

FIG. 15 is a schematic, cross-sectional diagram illustrating a non-volatile memory device in accordance with still another preferred embodiment of this invention. As shown in FIG. 15, a semiconductor substrate 100 such as a P type silicon substrate is prepared. Likewise, a memory array region 101 and a peripheral circuit region 102 are defined on the semiconductor substrate 100. A diffusion cell well 100 such as an N well, which is formed by using conventional ion implantation methods, is provided in the semiconductor substrate 100 within the memory array region 101. STI regions 130 are formed on the main surface of the semiconductor substrate 100 to provide device isolation. The difference between the preferred embodiment of FIG. 1 and the preferred embodiment of FIG. 15 is that, in FIG. 15, in addition to the high-voltage MOS transistor 310, a transistor 510 having the same structure as that of the storage transistor in memory array region 101 and a low-voltage MOS transistor are provided in peripheral circuit region 102. The transistor 510 has an ONO dielectric stack 512, gate electrode 514 and source/drain regions 516. According to this invention, the transistor 510 functions as a circuit element for trimming reference circuit of the sense amplifier. This makes the reference circuit of the sense amplifier operate in a more precise manner. From another aspect, the transistor 510 may be inserted into the sense amplifier and provide the sense amplifier with reference current. It is advantageous to do so because the sense amplifier and the reference current thereof can keep track of the characteristic variation of the memory cells in the memory array region, thereby increasing the memory window, getting better yield and reliability.

According to still another preferred embodiment, in addition to the high-voltage MOS transistor 310 and the low-voltage MOS transistor 320, an intermediate-voltage MOS transistor (not shown) may be formed in the peripheral circuit region 102. The gate dielectric layer of the intermediate-voltage MOS transistor is thicker than the gate dielectric layer 322, while the gate dielectric layer of the intermediate-voltage MOS transistor is thinner than the gate dielectric layer 312.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A non-volatile memory device, comprising:
  a memory cell unit disposed in a memory array region of the non-volatile memory device, the memory cell unit comprising a single-poly PMOS access transistor and a single-poly PMOS storage transistor serially connected to the single-poly PMOS access transistor through a floating P type doping region commonly shared by the single-poly PMOS access transistor and the single-poly PMOS storage transistor, wherein the single-poly PMOS access transistor comprises an access gate, an access gate dielectric of single silicon oxide layer, a P type source doping region and the floating P type doping region acting as a drain of the single-poly PMOS access transistor; the single-poly PMOS storage transistor comprises a control gate, a charge storage structure, a P type drain doping region and the floating P type doping region acting as a source of the single-poly PMOS storage transistor; and
  a high-voltage MOS transistor disposed in a peripheral circuit region of the non-volatile memory device, the high-voltage MOS transistor comprising a high-voltage gate and a high-voltage gate dielectric layer having a thickness equal to that of the access gate dielectric of single silicon oxide layer.

2. The non-volatile memory device according to claim 1 wherein the charge storage structure is an ONO dielectric stack comprising a bottom oxide layer, a silicon nitride trapping layer and a top oxide layer.

3. The non-volatile memory device according to claim 2 wherein the bottom oxide layer has a thickness of about 15-35 angstroms.

4. The non-volatile memory device according to claim 2 wherein the silicon nitride trapping layer has a thickness of about 50-100 angstroms.

5. The non-volatile memory device according to claim 2 wherein the top oxide layer has a thickness of about 45-100 angstroms.

6. The non-volatile memory device according to claim 1 wherein the access gate dielectric of single silicon oxide layer has a thickness of about 50-200 angstroms.

7. The non-volatile memory device according to claim 1 wherein the high-voltage gate dielectric layer is made of silicon dioxide.

8. The non-volatile memory device according to claim 1 wherein the memory cell unit is formed on an N well.

9. A non-volatile memory device, comprising:
  a memory cell unit disposed in a memory array region of the non-volatile memory device, the memory cell unit comprising a PMOS access transistor and a PMOS storage transistor serially connected to the PMOS access transistor through a floating and commonly used P type doping region, wherein the PMOS access transistor comprises an access gate, an access gate dielectric layer, a P type source doping region and the floating and commonly used P type doping region acting as a drain of the PMOS access transistor; the PMOS storage transistor comprises a control gate, a charge storage structure, a P type drain doping region and the floating and commonly used P type doping region acting as a source of the PMOS storage transistor;
  a high-voltage MOS transistor disposed in a peripheral circuit region of the non-volatile memory device, the high-voltage MOS transistor comprising a high-voltage gate and a high-voltage gate dielectric layer having a thickness equal to that of the access gate dielectric layer; and
  a MOS transistor disposed in the peripheral circuit region and the MOS transistor comprising a gate and the charge storage structure underneath the gate.

10. The non-volatile memory device according to claim 9 wherein the charge storage structure is an ONO dielectric stack comprising a bottom oxide layer, a silicon nitride trapping layer and a top oxide layer.

11. The non-volatile memory device according to claim 10 wherein the bottom oxide layer has a thickness of about 15-35 angstroms.

12. The non-volatile memory device according to claim 10 wherein the silicon nitride trapping layer has a thickness of about 50-100 angstroms.

13. The non-volatile memory device according to claim 10 wherein the top oxide layer has a thickness of about 45-100 angstroms.

14. The non-volatile memory device according to claim 9 wherein the access gate dielectric layer has a thickness of about 50-200 angstroms.

15. The non-volatile memory device according to claim 9 wherein the high-voltage gate dielectric layer is made of silicon dioxide.

16. The non-volatile memory device according to claim 9 wherein the memory cell unit is formed on an N well.

17. A non-volatile memory device, comprising:
  a memory cell unit disposed in a memory array region of the non-volatile memory device, the memory cell unit comprising a PMOS access transistor and a PMOS storage transistor serially connected to the PMOS access transistor through a floating and commonly used P type doping region, wherein the PMOS access transistor comprises an access gate, an access gate dielectric layer, a P type source doping region and the floating and commonly used P type doping region acting as a drain of the PMOS access transistor; the PMOS storage transistor comprises a control gate, a charge storage structure, a P type drain doping region and the floating and commonly used P type doping region acting as a source of the PMOS storage transistor;
  a high-voltage MOS transistor disposed in a peripheral circuit region of the non-volatile memory device, the high-voltage MOS transistor comprising a high-voltage gate and a high-voltage gate dielectric layer having a thickness equal to that of the access gate dielectric layer; and
  a low-voltage MOS transistor disposed in the peripheral circuit region of the non-volatile memory device, the low-voltage MOS transistor comprising a low-voltage gate and a low-voltage gate dielectric layer having a thickness that is smaller than that of the high-voltage gate dielectric layer.

18. The non-volatile memory device according to claim 17 wherein a photoresist pattern is used to mask the memory array region and high-voltage device area of the peripheral circuit region, and using the photoresist pattern as an etching hard mask, an low-voltage device area is exposed and the low-voltage gate dielectric layer is grown on the exposed low-voltage device area of the peripheral circuit region.

19. The non-volatile memory device according to claim 17 wherein the non-volatile memory device further comprises a MOS transistor disposed in the peripheral circuit region and the MOS transistor comprises a gate and the charge storage structure.

20. The non-volatile memory device according to claim 17 wherein the non-volatile memory device further comprises an intermediate-voltage MOS transistor disposed in the peripheral circuit region and the intermediate-voltage MOS transistor comprises an intermediate-voltage gate and an intermediate-voltage gate dielectric layer.

21. The non-volatile memory device according to claim 17 wherein the charge storage structure is an ONO dielectric stack comprising a bottom oxide layer, a silicon nitride trapping layer and a top oxide layer.

22. The non-volatile memory device according to claim 21 wherein the bottom oxide layer has a thickness of about 15-35 angstroms.

23. The non-volatile memory device according to claim 21 wherein the silicon nitride trapping layer has a thickness of about 50-100 angstroms.

24. The non-volatile memory device according to claim 21 wherein the top oxide layer has a thickness of about 45-100 angstroms.

25. The non-volatile memory device according to claim 17 wherein the access gate dielectric layer has a thickness of about 50-200 angstroms.

26. The non-volatile memory device according to claim 17 wherein the low-voltage gate dielectric layer has a thickness of about 15-100 angstroms.

27. The non-volatile memory device according to claim 17 wherein the low-voltage gate dielectric layer is made of silicon dioxide.

28. The non-volatile memory device according to claim 17 wherein the high-voltage gate dielectric layer is made of silicon dioxide.

29. The non-volatile memory device according to claim 17 -wherein the memory cell unit is formed on an N well.

* * * * *